(12) United States Patent
Kim

(10) Patent No.: US 8,134,879 B2
(45) Date of Patent: Mar. 13, 2012

(54) SEMICONDUCTOR MEMORY DEVICE HAVING REDUNDANCY CIRCUIT FOR REPAIRING DEFECTIVE UNIT CELL, AND METHOD FOR REPAIRING DEFECTIVE UNIT CELL

(75) Inventor: Kwi-Dong Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 587 days.

(21) Appl. No.: 12/326,537

(22) Filed: Dec. 2, 2008

(65) Prior Publication Data
US 2009/0185438 A1  Jul. 23, 2009

(30) Foreign Application Priority Data

Jan. 18, 2008 (KR) .................. 10-2008-0005631

(51) Int. Cl.
*G11C 7/00* (2006.01)

(52) U.S. Cl. ............. 365/200; 365/225.7; 365/189.07
(58) Field of Classification Search .......... 365/200, 365/225.7, 189.07
See application file for complete search history.

(56) References Cited

U.S. PATENT DOCUMENTS

| 5,732,029 | A | 3/1998 | Lee et al. |
| 5,970,001 | A * | 10/1999 | Noda et al. .............. 365/200 |
| 6,353,570 | B2 * | 3/2002 | Hwang et al. ............ 365/225.7 |
| 6,967,878 | B2 | 11/2005 | Dono et al. |
| 7,184,335 | B2 | 2/2007 | Boldt et al. |
| 2002/0012282 | A1 * | 1/2002 | Saito et al. .............. 365/200 |
| 2005/0041491 | A1 | 2/2005 | Kyung |
| 2007/0086252 | A1 | 4/2007 | Lim et al. |

FOREIGN PATENT DOCUMENTS

| JP | 09-167499 | 6/1997 |
| JP | 2000-076889 | 3/2000 |
| JP | 2001-023391 | 1/2001 |
| JP | 2001-056361 | 2/2001 |
| KR | 1996-005899 | 5/1996 |
| KR | 1020020041549 A | 6/2002 |
| KR | 100744124 B1 | 7/2007 |

OTHER PUBLICATIONS

Notice of Preliminary Rejection issued from Korean Intellectual Property Office on May 29, 2009 with an English Translation.

* cited by examiner

*Primary Examiner* — Son Dinh
(74) *Attorney, Agent, or Firm* — IP & T Group LLP

(57) ABSTRACT

A semiconductor memory device includes banks of unit cells, wherein two or more adjacent banks of the banks share a redundancy circuit configured to perform a defect repair operation when an address for accessing a defective unit cell is input.

19 Claims, 17 Drawing Sheets

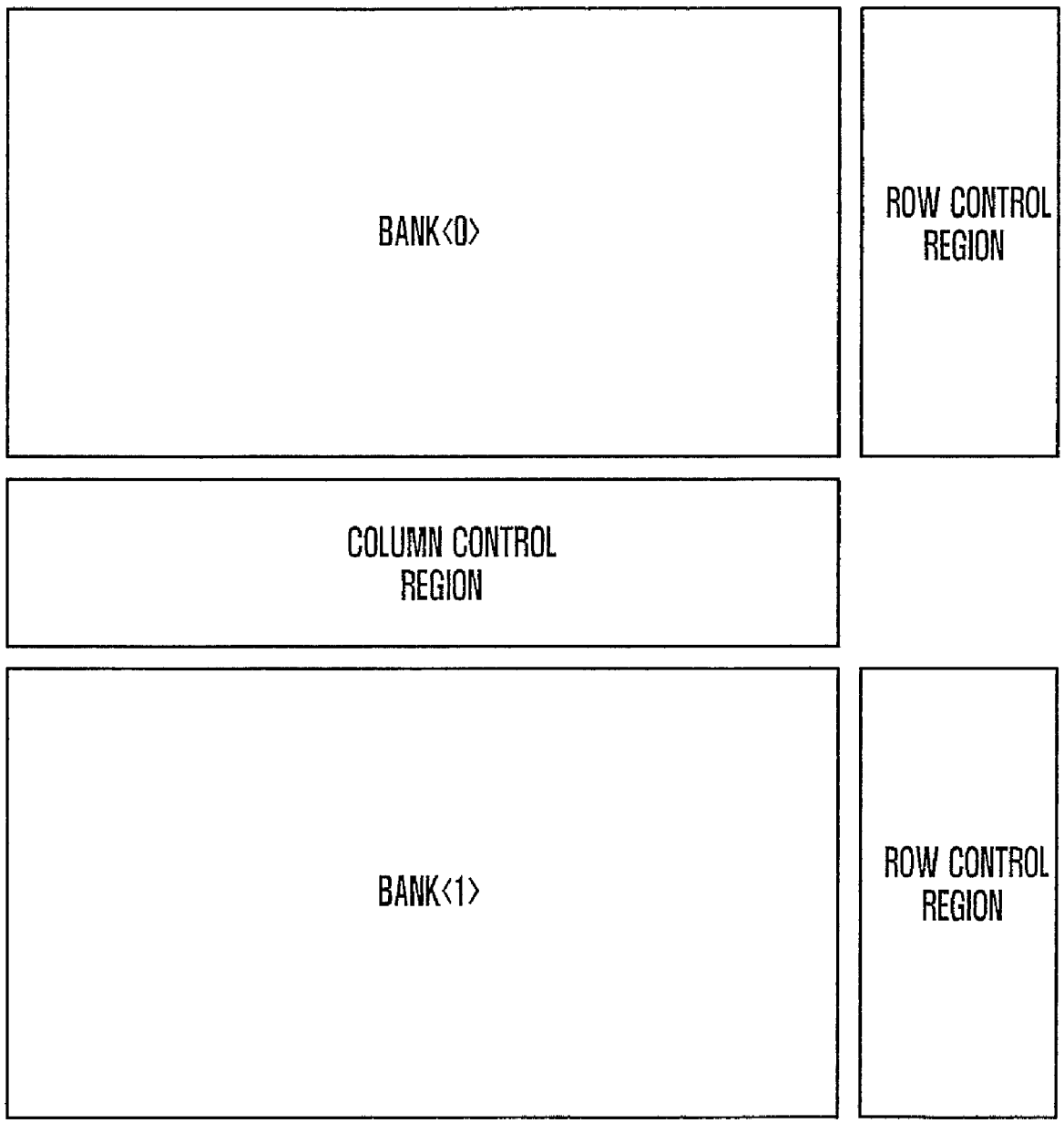

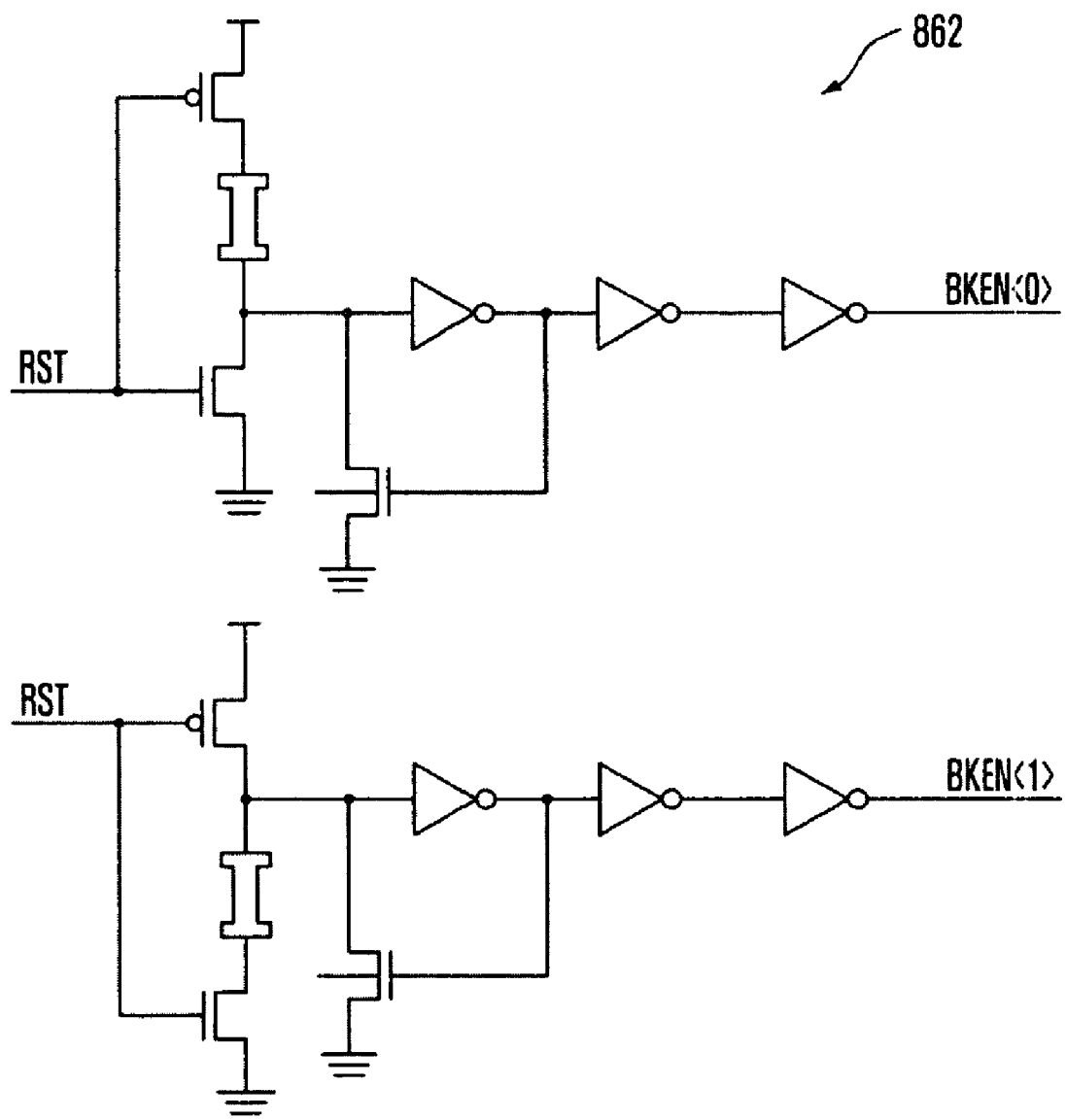

SEMICONDUCTOR MEMORY DEVICE HAVING REDUNDANCY CIRCUIT FOR REPAIRING DEFECTIVE UNIT CELL, AND METHOD FOR REPAIRING DEFECTIVE UNIT CELL

CROSS-REFERENCE TO RELATED APPLICATION

The present invention claims priority of Korean patent application number 2008-0005631, filed on Jan. 18, 2008, which is incorporated by reference in its entirety.

BACKGROUND OF THE INVENTION

The present invention relates to a semiconductor memory device, and more particularly, to a semiconductor memory device that increases the efficiency of a redundancy circuit for repairing a defective unit cell and reduces a total area, and a method of repairing a defective unit cell in a semiconductor memory device.

In a system with a variety of semiconductor devices, a semiconductor memory device serves as data storage. The semiconductor memory device outputs data corresponding to addresses received from a data processor, e.g., a central processing unit (CPU), or stores data received from the data processor into memory cells selected by addresses.

As the operating speed of the system increases and semiconductor integrated circuit technologies advance, semiconductor memory devices are required to input and output data at higher speed. Recently, there has been an ongoing demand for semiconductor memory devices that can store much more data, read and write data more rapidly, and reduce power consumption as well. Furthermore, in line with the development of semiconductor memory fabrication technology, the width of a line for transferring various kinds of signals in a semiconductor memory device, and the size of a unit cell for storing data has become smaller and smaller. As a result, numbers of signal lines and unit cells included in one semiconductor chip are increasing rapidly with the increasing demands for high capacity semiconductor memory.

For this reason, the design and fabrication process of a semiconductor memory device have become more complicated. As each element included in a semiconductor memory device shrinks in size, defects tend to easily occur and particularly, many defects exist between a variety of signal lines or between a signal line and a unit cell. This causes a total defect ratio of the semiconductor memory device to increase. If such defects are not repaired in the semiconductor memory device, production yields may drop. To repair defective unit cells, therefore, the semiconductor memory device generally includes a redundancy circuit configured to detect and repair defects.

The redundancy circuit, which can replace defective unit cells, generally is included in each of a plurality of banks in a semiconductor memory device. Each of the banks includes a cell matrix provided with many unit cells, a row control region where circuits for accessing row addresses are provided, and a column control region where circuits for accessing column addresses are provided. The redundancy circuit includes a row redundancy circuit configured to repair a row address of a defective unit cell, and a column redundancy circuit configured to repair a column address of the defective unit cell. The row redundancy circuit and the column redundancy circuit are respectively included in the row control region and the column control region in each bank.

Meanwhile, a semiconductor memory device becomes more highly integrated, and endeavors are being made to reduce a total area of the semiconductor memory device for improving productivity. In practice, as a semiconductor memory device decreases in area, it is possible to produce a greater number of semiconductor memory devices using one wafer, which improves productivity and reduces fabrication cost. However, as the storage capacity of a semiconductor memory device becomes larger, and thus the number of unit cells also increases, resulting in an increase in the size of a redundancy circuit for replacing a defective unit cell. This makes it difficult to reduce the total area of a semiconductor memory device after all.

SUMMARY OF THE INVENTION

Embodiments of the present invention are directed to providing a semiconductor memory device including a redundancy circuit, capable of supporting a repair operation on each bank of unit cells and reducing a total area as well, in which adjacent banks share the redundancy circuit for repairing a defective unit cell by replacing the defective unit cell.

In accordance with one aspect of the present invention, there is provided a semiconductor memory device, which includes a plurality of banks, each of which includes a plurality of unit cells, wherein two or more adjacent banks of the banks share a redundancy circuit configured to perform a defect repair operation when an address for accessing a defective unit cell is input.

In accordance with another aspect of the present invention, there is provided a semiconductor memory device, which includes a redundancy circuit configured to perform a defect repair operation through stored data of a defective unit cell in two adjacent banks when an input address for accessing data corresponds to the defective unit cell, wherein the redundancy circuit is disposed between the two adjacent banks.

In accordance with another aspect of the present invention, there is provided a method of repairing a defective unit cell in a semiconductor memory device, which includes storing location data of a unit cell of two adjacent banks, outputting column location data of the defective unit cell having a row address in the two banks, comparing the column location data with a column address, and notifying whether to perform a defect repair operation according to which bank the defective unit cell belongs to as between the two banks, when the column location data is consistent with the column address.

In accordance with still another aspect of the present invention, there is provided a semiconductor memory device, which includes a fuse unit configured to store row and column address data of a defective unit cell of two adjacent banks, and to output the column address data of the defective unit cell according to row access data, a bank selection unit configured to transfer the row access data and column access data of the two banks, and to output location data locating one of the two banks including the defective unit cell, and a comparison unit configured to compare the column access data output from the bank selection unit with the column address data output from the fuse unit, and to determine whether to perform a defect repair operation according to the location data of a bank that including the defective unit cell, which is output from the bank selection unit, when the column access data is consistent with the column address data.

In the semiconductor memory device of the present invention, adjacent banks share a redundancy circuit for repairing a defective unit cell, thus making it possible to reduce total area of the device. The semiconductor memory device includes a plurality of banks, and, if a unit cell of an unspecified one of the banks has a defect after the fabrication of the device, a redundancy circuit repairs the defect, thereby to increase productivity by replacing a defective unit cell. The redundancy circuit should be designed to replace each of the unit cells, and memorize location data of the defective unit cell. As the number of unit cells in the semiconductor memory device increases, the redundancy circuit increases in size correspondingly. This leads to an increase in an area of a highly integrated semiconductor memory device, which impedes the enhancement of productivity. Therefore, according to a further aspect of the invention a semiconductor memory device has a stack bank structure where column control regions of adjacent banks are arranged to contact each other, and the adjacent banks share a redundancy circuit, and it thereby is possible to reduce a size of the redundancy circuit and increase efficiency.

BRIEF DESCRIPTION OF THE DRAWINGS

FIG. 7A is a block diagram of a semiconductor memory device in accordance with an embodiment of the present invention.

FIG. 10A is a circuit diagram of a bank fuse unit in FIG. 9.

DESCRIPTION OF SPECIFIC EMBODIMENTS

Hereinafter, a semiconductor memory device having a redundancy circuit for repairing a defective unit cell, and a method for repairing the defective unit cell in accordance with the invention will be described in detail with reference to the accompanying drawings.

Compared to the configuration of a conventional semiconductor memory device where column control regions of a plurality of banks are designed to contact a peripheral circuit region, the invention provides a semiconductor memory device having a stack bank structure designed to reduce a total area thereof. Herein, the stack bank structure means that row control regions or column control regions of adjacent banks of a plurality of banks in a semiconductor memory device are arranged to contact each other.

Figure 1A:
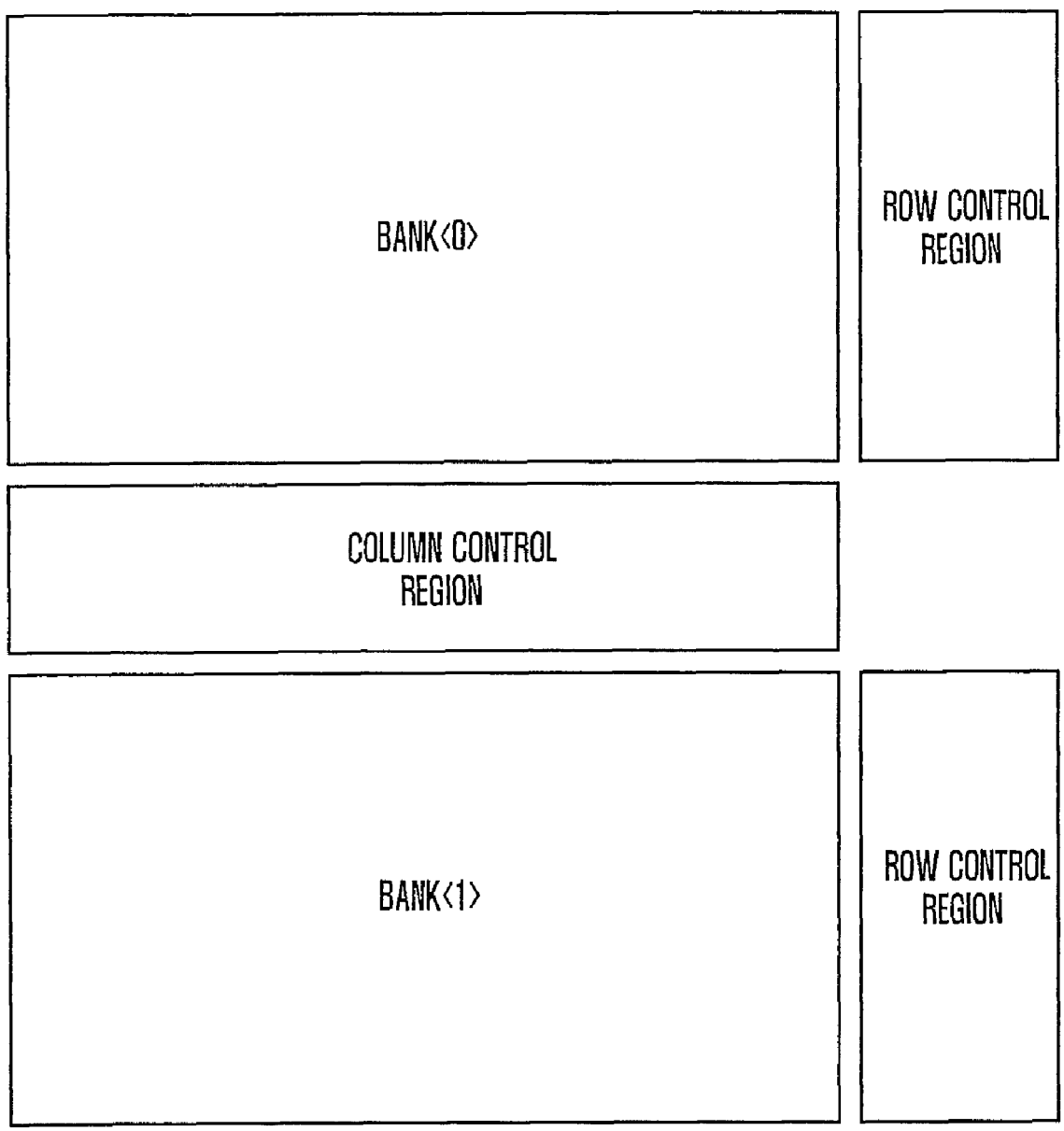
FIG. 1A is a block diagram of a semiconductor memory device having a stack bank structure.

FIG. 1A is a block diagram of a semiconductor memory device having a stack bank structure.

Referring to FIG. 1A, column control regions of adjacent banks are arranged to contact each other in the semiconductor memory device having the stack bank structure.

Specifically, each of the banks mainly includes cell matrices provided with a plurality of unit cells, a row control region provided with a row decoder (XDEC) configured to control word lines, and a column control region provided with a column decoder (YDEC) configured to selectively transfer data output from the unit cell to the outside. In addition, the column control region of each bank in the semiconductor memory device includes a redundancy circuit having a plurality of fuses.

Figure 1B:
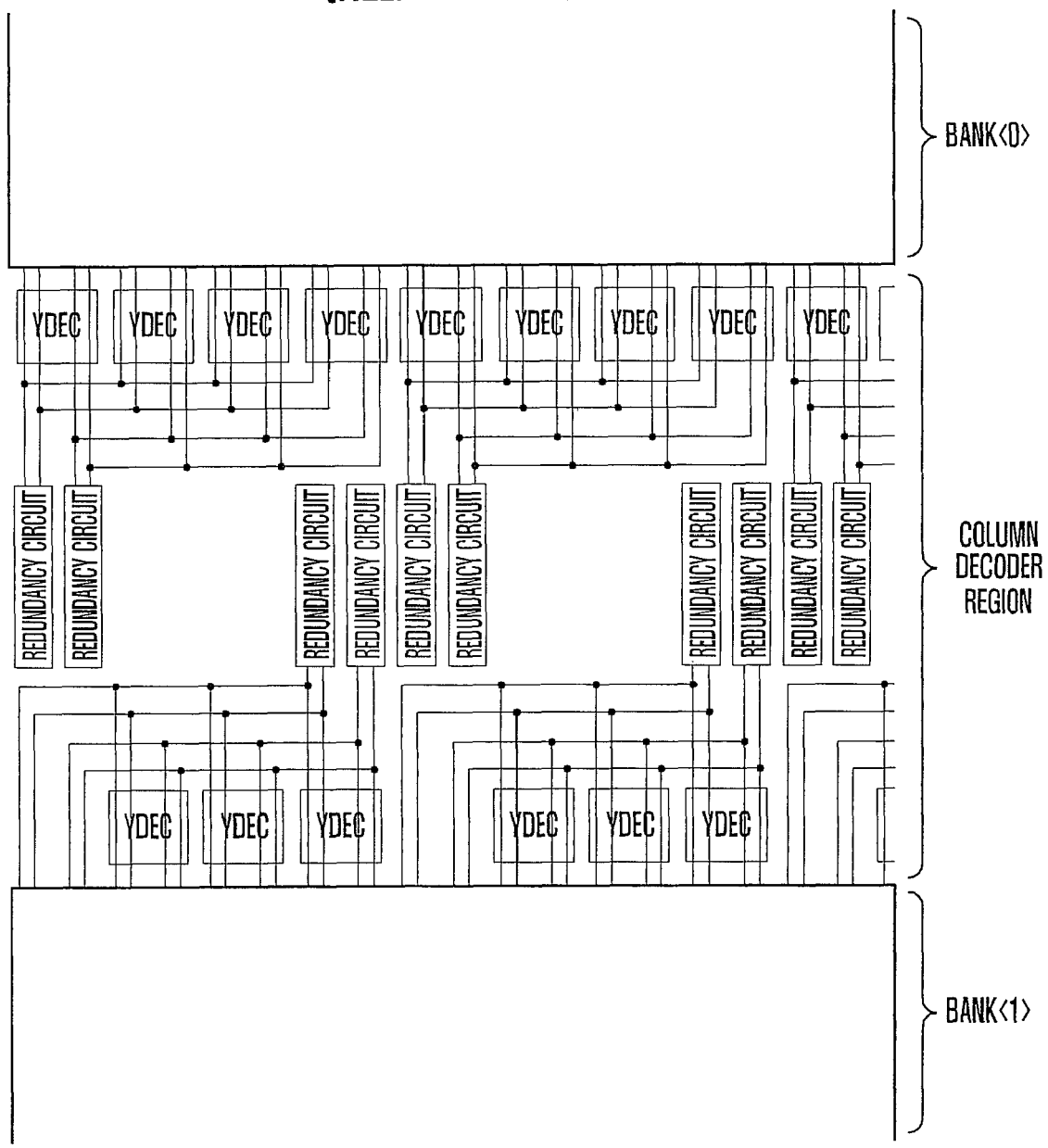
FIG. 1B is a block diagram illustrating a column control region of the semiconductor memory device of FIG. 1A in detail.

FIG. 1B is a block diagram illustrating the column control region of the semiconductor memory device of FIG. 1A in detail. In particular, FIG. 1B illustrates a column redundancy circuit and the column decoder (YDEC) in the column control region.

Referring to FIG. 1B, each of adjacent banks includes a column redundancy circuit. The column redundancy circuit receives a column address for controlling the cell matrix in the bank, and functions to replace a column address corresponding to a defective unit cell with another address when a defect occurs in the unit cell. Since it is difficult to know the location of a defective unit cell among the unit cells in advance, the column redundancy circuit should be provided in plural number corresponding to column addresses of each bank. Accordingly, as illustrated in FIG. 1B, the semiconductor memory device includes a column redundancy circuit corresponding to column addresses of an upper bank, and a column redundancy circuit corresponding to column addresses of a lower bank.

Figure 2:
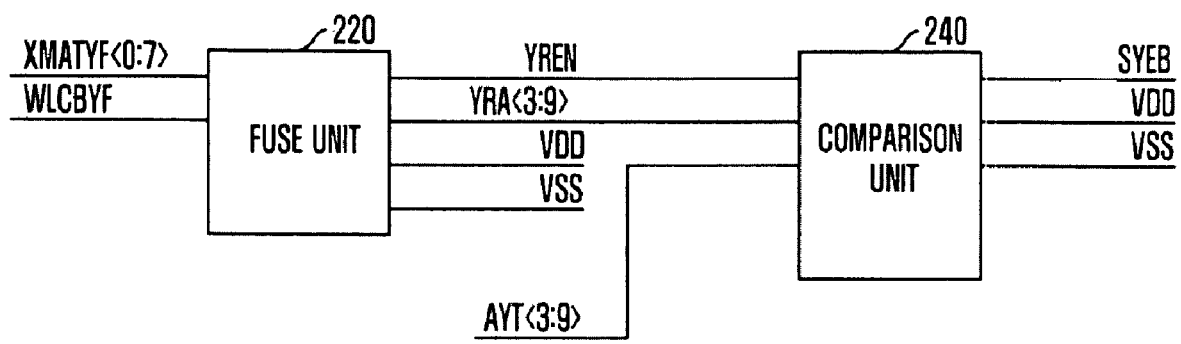
FIG. 2 is a block diagram illustrating a redundancy circuit of the semiconductor memory device in FIG. 1A.

FIG. 2 is a block diagram illustrating a redundancy circuit of the semiconductor memory device of FIG. 1A.

Referring to FIG. 2, the redundancy circuit includes a fuse unit 220 and a comparison unit 240. The semiconductor memory device includes a plurality of banks, each of which is provided with a plurality of cell matrices having a plurality of cells.

The fuse unit 220 receives a bank active signal WLCBYF activated when a corresponding bank is enabled, and cell MAT selection signals XMATYF<0:7> indicating cell matrices selected from among the cell matrices in the bank. When the bank is enabled, the fuse unit 220 activates a defect generation signal YREN indicating that there is a defective unit cell, and outputs column defect addresses YRA<3:9> to the comparison unit 240. Here, the column defect address YRA<3:9>indicates that a column address corresponding to a defective unit cell should be replaced. When the defect generation signal YREN is activated, the comparison unit 240 compares the column defect address YRA<3:9> with a column address AYT<3:9> input from the outside (hereinafter, referred to as 'external column address' for simplicity) to output a redundancy enable signal SYEB indicating that a column address should be replaced if the column address AYT<3:9> accesses a defective unit cell.

Herebelow, detailed configuration and operation of the fuse unit 220 and comparison unit 240 will be described.

Figure 3:
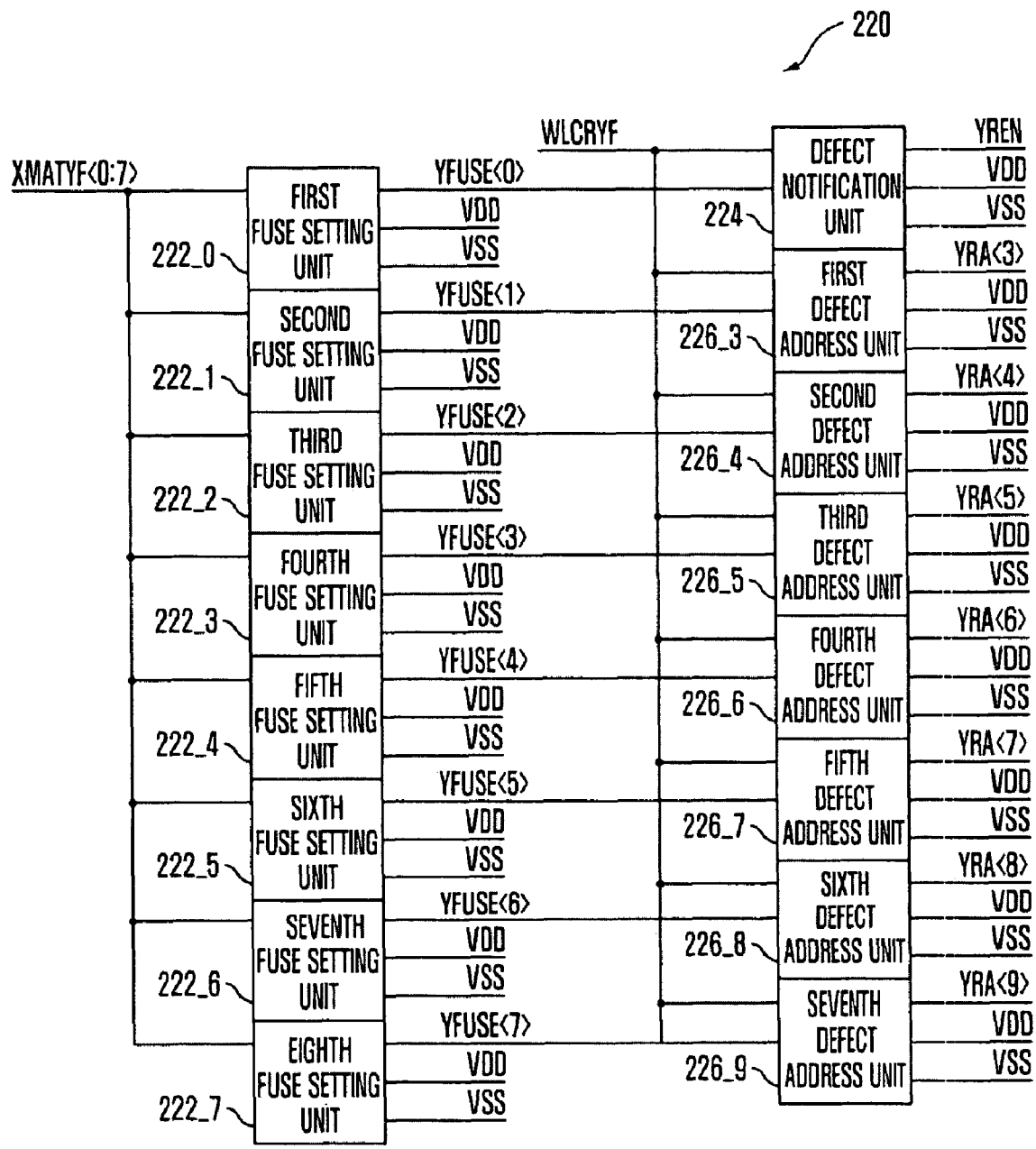
FIG. 3 is a block diagram of a fuse in FIG. 2.

FIG. 3 is a block diagram of the fuse unit 220 in FIG. 2.

Referring to FIG. 3, the fuse unit 220 includes fuse setting units 222_0 to 222_7 configured to determine whether a defective unit cell is accessed according to the cell MAT selection signals XMATYF<0:7>, a defect notification unit 224 configured to output the defect generation signal YREF according to an output of the first fuse setting unit 222_0 when the bank active signal WLCBYF is activated, and defect address units 226_3 to 226_9 configured to output the column defect addresses YRA<3:9> indicating locations of the defective unit cells according to outputs of the second to eighth fuse setting units 222_1 to 222_7.

Number of the defect address units 226_3 to 226_9 is equal to number of bits of the column address of the corresponding bank, and number of the fuse setting units 222_0 to 222_7 is one more than the number of the defect address units 226_3 to 226_9. Here, description will be exemplarily made on the semiconductor memory device having 7-bit column addresses, and it is assumed that the fuse unit 220 can determine defects of all of unit cells included in the bank. In addition, as illustrated in FIG. 1A, each bank in the semiconductor memory device is mainly configured with an upper cell matrix UP and a lower cell matrix DOWN. Each of the upper and lower cell matrices UP and DOWN includes 8 cell matrices. Accordingly, to detect the location of a unit cell selected by an external address, 8-bit cell MAT selection signals XMATYF<0:7> are input to the fuse setting units 222_0 to 222_7, respectively.

The defect notification unit 224 has the same configuration as the defect address units 226_3 to 226_9. In detail, the defect notification unit 224 receives the result according to the state of a fuse corresponding to the row address of the defective unit cell, and outputs the defect generation signal YREN. The meaning the defect generation signal YREN is activated is that a defective unit cell exists in the row address. In contrast, the defect address unit 226_3 to 226_9 receives the result according to the state of a fuse corresponding to the column address of the defective unit cell, and outputs the column defect address YRA<3:9>.

Figure 4A:
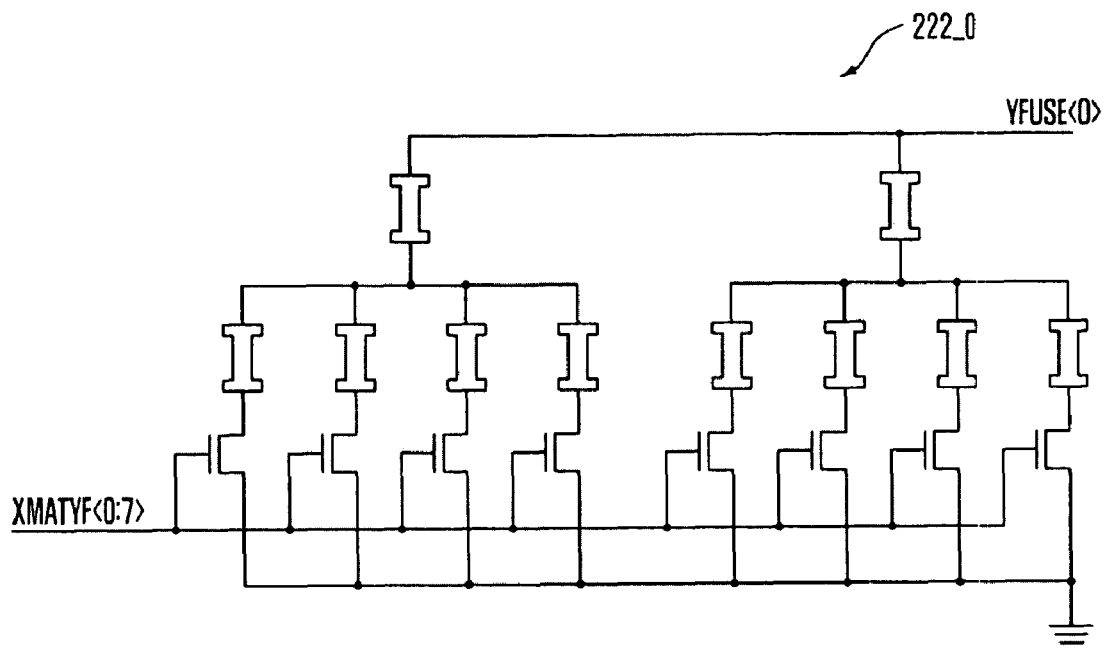
FIG. 4A is a circuit diagram of a fuse setting unit in FIG. 3.

FIG. 4A is a circuit diagram of the fuse setting unit 222_0 in FIG. 3.

Referring to FIG. 4A, the fuse setting unit 222_0 includes eight fuses connected in parallel, which correspond to the respective cell MAT selection signals XMATYF<0:7>, and eight MOS transistors each of which receives each of the cell MAT selection signals XMATYF<0:7> through a gate thereof.

A fuse corresponding to a defective unit cell detected during testing of a semiconductor memory device is cut out among the eight fuses connected in parallel. When the cell MAT selection signal XMATYF<0:7> is input, the MOS transistor corresponding to a cell matrix to be selected is turned on to thereby transfer a low-level signal. However, if the cell matrix to be selected includes the defective unit cell, a fuse state signal YFUSE<0> maintains its floating state because the fuse is cut. On the contrary, if the cell matrix to be selected does not include the defective unit cell, the fuse state signal YFUSE<0> has a logic low level because the fuse is connected.

Here, eight fuses connected in parallel in the first fuse setting unit 222_0 among the fuse setting units 222_0 to 222_7 which are shown in FIG. 3, are cut when they correspond to the cell matrix having the defective unit cell regardless of column addresses. Therefore, the first fuse setting unit 222_0 outputs an activated defect generation signal YREN when it accesses the cell matrix having the defective unit cell.

However, eight fuses connected in parallel and included in each of the second to eighth fuse setting units 222_1 to 222_7 are cut when they correspond to the column address corresponding to each fuse setting unit and the location of the cell matrix which is associated with a row address. In the result, the semiconductor memory device memorizes an accurate location of the defective unit cell through the state of the fuse in each of the second to eighth fuse setting units 222_1 to 222_7. More specifically, a fuse corresponding to a bit '1' (logic high level) of the column address indicating a defective unit cell is cut among the fuses in the second to eighth fuse setting units 222_1 to 222_7 according to one of the cell MAT selection signals XMATYF<0:7> indicating the defective unit cell. In contrast, a fuse corresponding to a bit '0' (logic low level) of the column address indicating the defective unit cell remains intact.

Consequently, when one of the cell MAT selection signals XMATYF<0:7> is activated and input to the fuse setting units 222_0 to 222_7 the fuse state signal YFUSE corresponding to a column address bit of logic high level indicating a defective unit cell is in floating state if there is the defective unit cell, whereas all the fuse state signals YFUSE corresponding to the column address bit of logic low level have logic low levels. Contrariwise, if there is no defective unit cell corresponding to the activated cell MAT selection signal XMATYF<0:7>, all of the fuse selection signals YFUSE<0:7> have logic low levels.

Figure 4B:
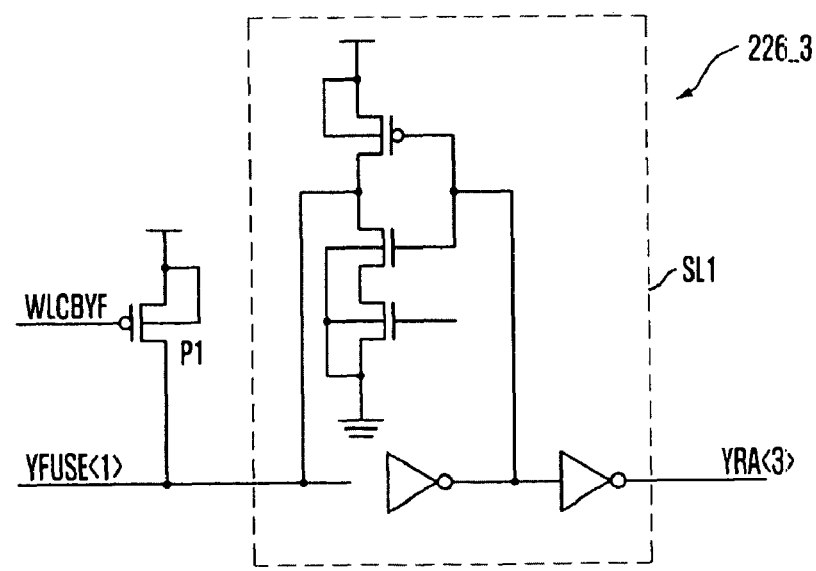
FIG. 4B is a circuit diagram of a defect address unit in FIG. 3.

FIG. 4B is a circuit diagram of a defect address unit 226_3 in FIG. 3.

Referring to FIG. 4B, the defect address unit 226_3 receives a fuse state signal YFUSE<1> from the corresponding second fuse setting unit 222_1 to output a column defect address YRA<3> according to a bank active signal WLCBYF. Specifically, the defect address signal 226_3 includes a MOS transistor P1 configured to transfer a power supply voltage VDD in response to the bank active signal WLCBYF, and a latch SL1 configured to output the column defect address YRA<3> according to an output of the MOS transistor P1 and the fuse state signal YFUSE<1>.

As for operation, when the bank active signal WLCBYF is not activated, that is, the bank active signal WLCBYF of logic low level is input to the MOS transistor P1, the fuse state signal YFUSE<1> has a logic high level. Afterwards, the latch SL1 outputs the column defect address YRA<3> of logic high level. On the contrary, when the bank active signal WLCBYF is activated to logic high level, the defect address unit 226_3 receives the fuse state signal YFUSE<1> output from the fuse setting unit 222_1 to output the column defect address YRA<3>.

The other defect address units 226_4 to 226_9 have the same internal configurations and operations as the defect address unit 226_3 described above. Therefore, when the corresponding bank is accessed and a defective unit cell does not exist in the accessed cell matrix, the defect address units 226_3 to 226_9 can output the column defect addresses YRA<3:9> of logic high level. When the corresponding bank is accessed and a defective unit cell exists in the accessed cell matrix, the column defect address YRA of logic low level is output according to the column address of logic high level of the defective unit cell. Resultingly, if the defective unit cell exists at the location of the unit cell to be accessed, the column defect address goes to logic high level according to the column address of logic high level of the defective unit cell. On the contrary, the column defect address corresponding to the column address of logic low level of the defective unit cell goes to logic low level.

As illustrated in FIG. 3, the fuse unit 220 of the redundancy circuit includes the defect address units 226_3 to 226_9 each of which corresponds to each bit of the column address AYT<3:9> for accessing the unit cell in the bank. That is, the defect address units 226_3 to 226_9 receive the fuse state signals YFUSE<1:7> from the fuse setting units 222_1 to 222_7 respectively, and can output the column defect addresses YRA<3:9> in response to the bank active signal WLCBYF. The semiconductor memory device, as illustrated in the drawings, is configured to compare the column addresses AYT<3:9> and detect a defective unit cell for repairing the defective unit cell, in case of using 7-bit column addresses AYT<3:9>. However, the number of defect address units may vary depending on the performance of the redundancy circuit and a design option of the semiconductor memory device. That is, numbers of the fuse setting units 222_1 to 222_7 and the defect address units 226_3 to 226_9 may be determined according to the number of bits of the column address for repairing the defective cell. For example, if the semiconductor memory device is designed such that a defect of each unit cell is not inspected and repaired but defective unit cells are repaired by replacing them in predetermined units when the defective unit cells exist, the semiconductor memory device may include smaller number of the defect address units 226_3 to 226_9 than the number of bits of the column address.

Figure 5:
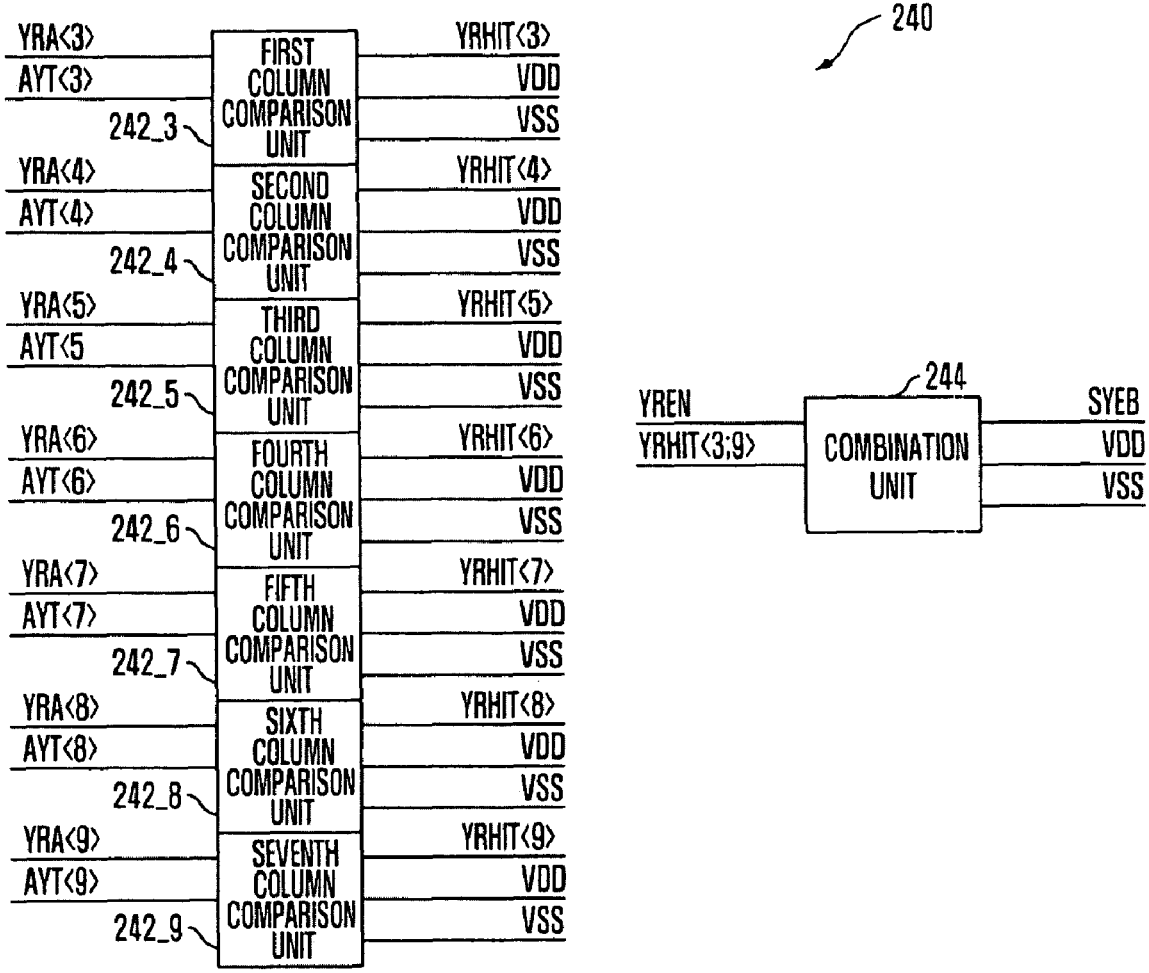
FIG. 5 is a block diagram of a comparison unit in FIG. 2.

FIG. 5 is a block diagram of the comparison unit 240 in FIG. 2.

Referring to FIG. 5, the comparison unit 240 includes column comparison units 242_3 to 242_9 configured to compare the column defect addresses YRA<3:9> output from the fuse unit 220 with the external column addresses AYT<3:9>, and a combination unit 244 configured to combine the comparison results output from the column comparison units 242_3 to 242_9 to output a redundancy enable signal SYEB. Here, number of the column comparison units 242_3 to 242_9 corresponds to number of the column defect addresses YRA<3:9>.

Figure 6A:
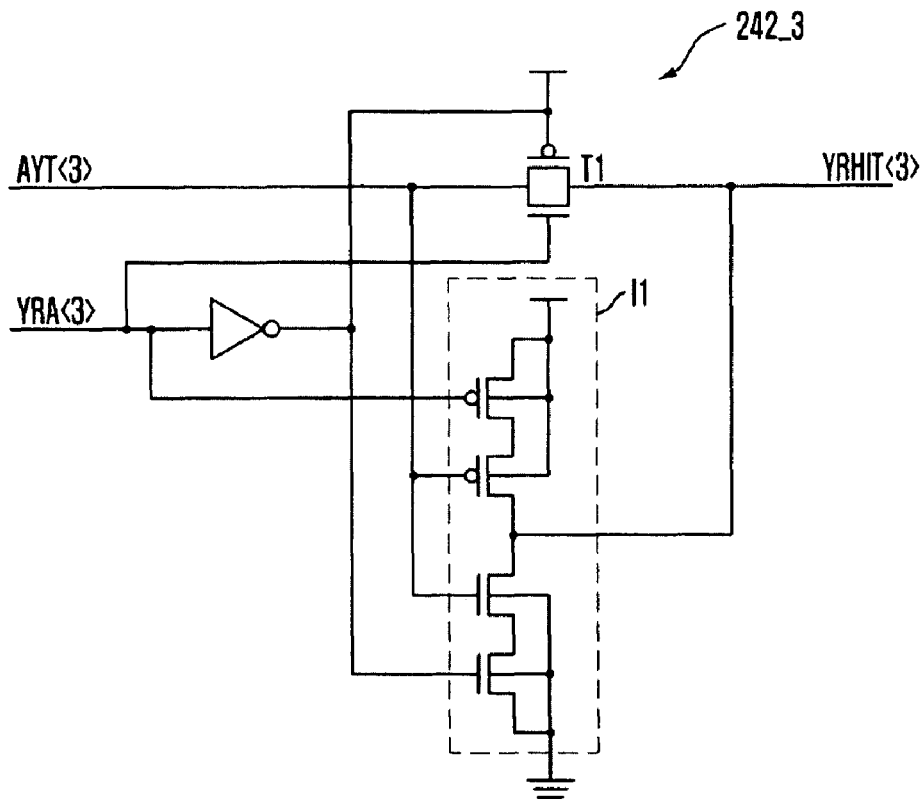
FIG. 6A is a circuit diagram of a column comparison unit in FIG. 5.

FIG. 6A is a circuit diagram of the column comparison unit 242_3 in FIG. 5.

Referring to FIG. 6A, the column comparison unit 242_3 includes a transfer gate T1 and an inverter I1. The transfer gate T1 transfers the column address AYT<3>, which is input when the column defect address YRA<3> is at logic high level, without a change in logic level to thereby output it as a comparison result YRHIT<3>. The inverter I1 inverts a logic level of the column address AYT<3> input when the column defect address YRA<3> is at logic low level, and transfers the inverted column address as a comparison result YRHIT<3>. Here, the column comparison units 242_3 to 242_9 shown in FIG. 5 have the same configuration, and thus further detailed description will be omitted.

As for the operation of the column comparison unit, when there is a defective unit cell in the cell matrix to be accessed, the column comparison units 242_3 to 242_9 invert logic levels of the column addresses AYT<3:9> corresponding to the column defect addresses YRA<3:9> of logic low level, and transfer the inverted column addresses to the combination unit 244. However, if all of unit cells of a cell matrix to be accessed are normal, the column comparison units 242_3 to 242_9 transfer the external column addresses AYT<3:9> as the comparison results YRHIT<3:9> without a change in logic level.

As such, if there exists a defective unit cell in a bank, the column address of logic high level is transferred without a change in logic level because the column defect address is at logic high level when the column address of the defective unit cell has logic high level; however, the column address of logic low level is inverted and then transferred because the column defect address is at logic low level when the column address of the defective unit cell has logic low level. That is, when the column address AYT<3:9> indicating the defective unit cell is input, the column comparison units 242_3 to 242_9 output the comparison results YRHIT<3:9> of which logic levels are all high. However, when the column address AYT<3:9> indicating a unit cell having no defect is input, the column comparison units 242_3 to 242_9 output the inverted column addresses AYT<3:9>.

Figure 6B:
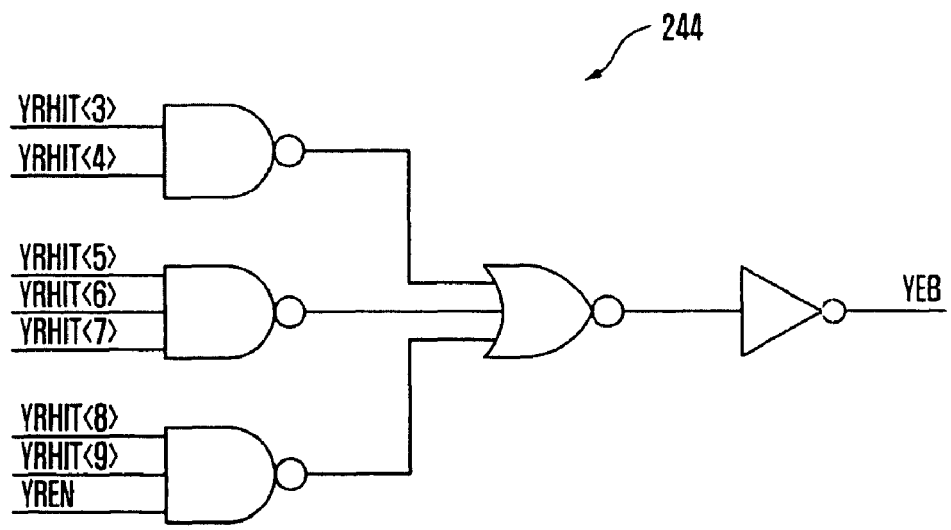
FIG. 6B is a circuit diagram of a combination unit in FIG. 5.

FIG. 6B is a circuit diagram of the combination unit 244 in FIG. 5.

Referring to FIG. 6B, the combination unit 244 activates a redundancy enable signal SYEB to logic low level when the comparison result YRHIT<3:9> output from the column comparison units 242_3 to 242_9 and the defect generation signal YREN output from the fuse unit 220 are all at logic high level. To this end, the combination unit 244 includes NAND gates configured to perform NAND operation on the comparison results YRHIT<3:9> and the defect generation signal YREN, and a NOR gate configured to perform NOR operation on outputs of the NAND gates, and an inverter configured to invert the output of the NOR gate to output the redundancy enable signal SYEB.

As described above, when an address for accessing a defective unit cell is input, all the comparison results YRHIT<3:9> output from the column comparison units 242_3 to 242_9 go to logic high level. Therefore, when all the comparison results YRHIT<3:9> are at logic high level, the combination unit 224 activates the redundancy enable signal SYEB, which indicates that a redundancy operation is required, to logic low level.

Figure 7B:
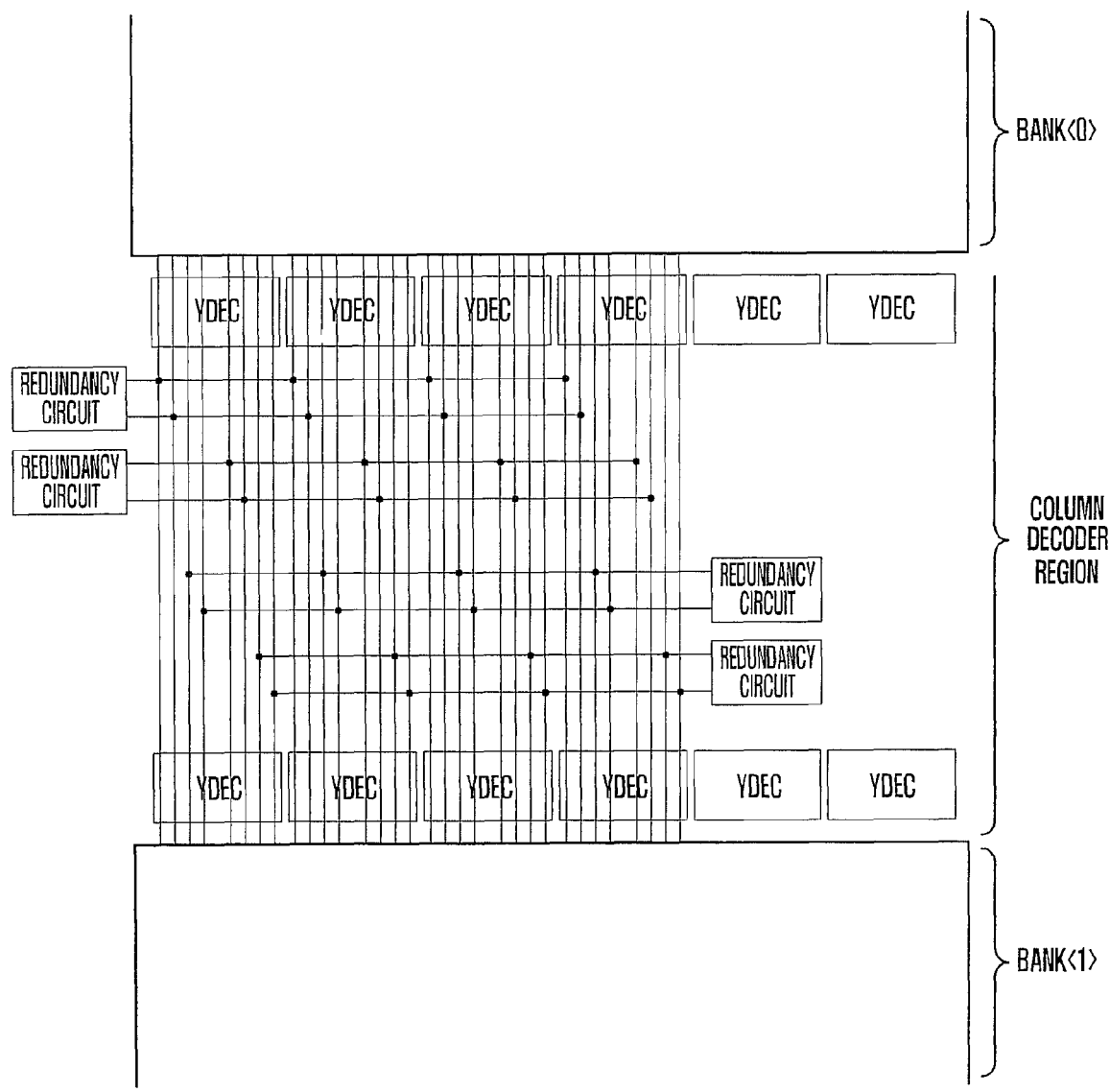
FIG. 7B is a block diagram illustrating a column control region of the semiconductor memory device of FIG. 7A in detail.

FIG. 7A is a block diagram of a semiconductor memory device in accordance with an embodiment of the invention. FIG. 7B is a block diagram illustrating a column control region of the semiconductor memory device of FIG. 7A in detail. In particular, FIG. 7B illustrates a column redundancy circuit and a column decoder YDEC in a column control region.

Referring to FIGS. 7A and 7B, the column control regions including column decoders YDEC are arranged to contact each other in the semiconductor memory device having a stack bank structure. Here, the column decoder YDEC selectively transfers data output from unit cells of adjacent banks to the outside. In addition, the redundancy circuit for repairing a defective unit cell is included in the column control regions contacting each other. The semiconductor memory device in accordance with the embodiment of the invention includes a plurality of banks each of which is provided with a plurality of unit cells. When an address for accessing the defective unit cell is input, two or more banks share the redundancy circuit for repairing the defective unit cell.

Two adjacent banks share the redundancy circuit included in the column control region of the semiconductor memory device illustrated in FIGS. 7A and 7B, which differs from the semiconductor memory device illustrated in FIGS. 1A and 1B. Specifically, it can be appreciated that a column redundancy circuit of adjacent banks are connected to both upper and lower banks. That is, the column redundancy circuits corresponding to the column addresses are respectively included in the banks of the semiconductor memory device illustrated in FIG. 1A, whereas the column redundancy circuit corresponding to the column address is shared by the two adjacent banks in the semiconductor memory device illustrated in FIG. 7A.

As described above, the redundancy circuit is used to replace a defective cell when a defect occurs in a specific unit cell of a bank configured with a plurality of unit cells after fabrication of the semiconductor memory device. Locations of defective unit cells in a bank always differ from each other, and defects scarcely occur at the same location between the adjacent banks. Accordingly, when the two adjacent banks share the redundancy circuit, it is possible to reduce the size of the conventional redundancy circuit by half. That is, the semiconductor memory device of the invention stores data of a defective unit cell in two adjacent banks in one redundancy circuit, and repairs the defective unit cell if an input address for accessing the data corresponds to the defective unit cell. In particular, such a redundancy circuit is disposed between the two adjacent banks, thus reducing a total size.

Figure 8:
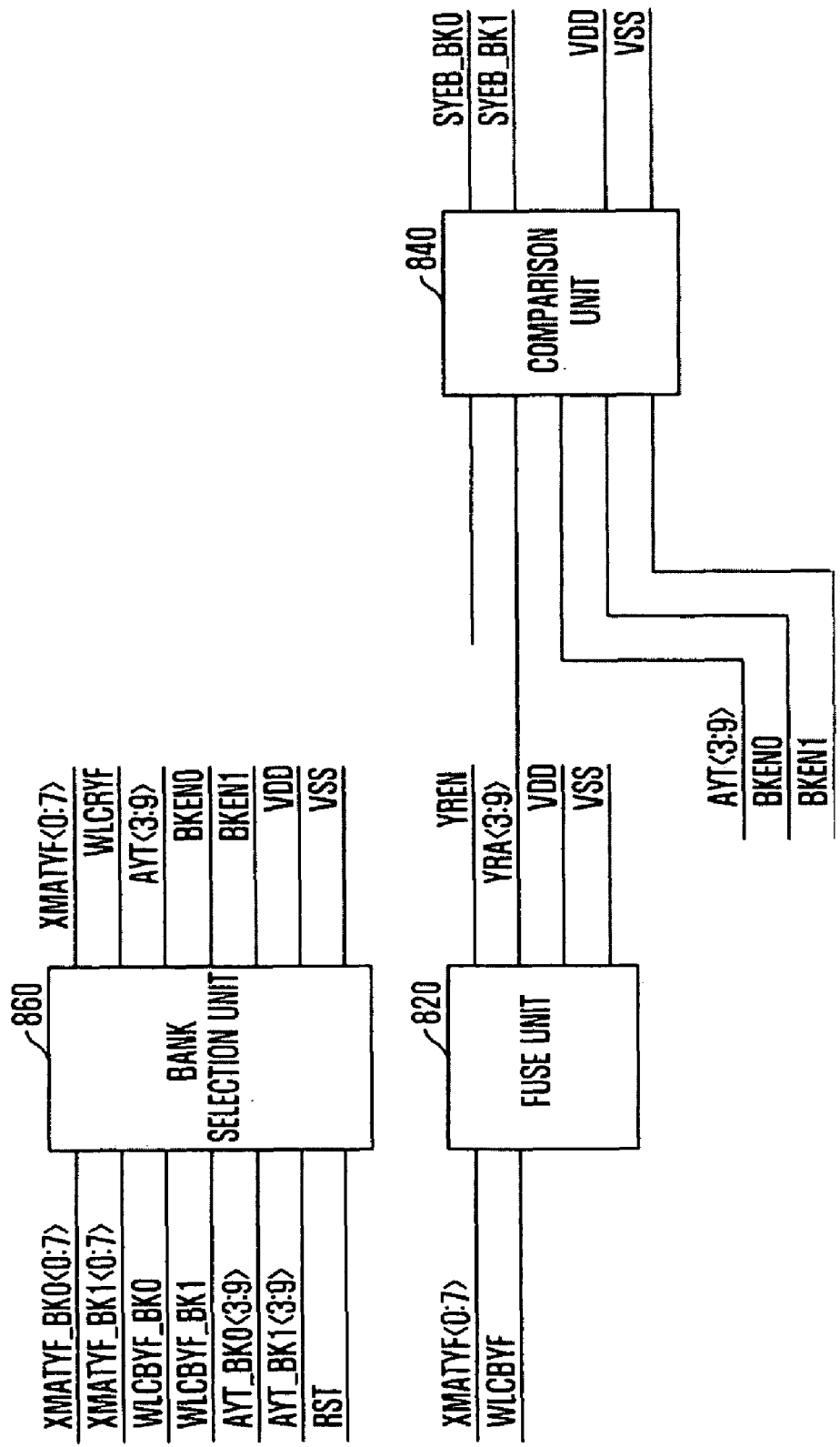
FIG. 8 is a block diagram illustrating a redundancy circuit of the semiconductor memory device of FIG. 7A.

FIG. 8 is a block diagram illustrating a redundancy circuit of the semiconductor memory device of FIG. 7A.

Referring to FIG. 8, the redundancy circuit includes a bank selection unit 860, a fuse unit 820, and a comparison unit 840. The semiconductor memory device includes a plurality of banks, each of which is configured with a plurality of cell matrices having a plurality of unit cells.

The fuse unit 820 stores data about row and column addresses of a defective unit cell of an two adjacent banks, and outputs column address data corresponding to input row access data. The bank selection unit 860 transfers column access data and row access data of two banks, and outputs data of one of the two banks having the defective unit cell. The comparison unit 840 compares the column access data output from the bank selection unit with the column address data output from the fuse unit 820, and then determines whether to perform a defect repair operation according to data of a bank having the defective unit cell output from the bank selection unit 860, if the column access data is consistent with the column address data. Here, the row access data includes cell MAT selection signals XMATYF_BK0<0:7> and XMATYF_BK1<0:7> for selecting a cell matrix in each bank, and bank active signals WLCBYF_BK0 and WLCBYF_BK1 for activating a word line in each bank. The column access data includes column addresses AYT_BK0<3:9> and AYT_BK1<3:9> of each unit cell to be accessed.

In more detail, the bank selection unit 860 allows the redundancy circuit connected to both two adjacent banks to be connected to one of the two banks having a defective unit cell. When a reset signal RST is input, the bank selection unit 860 activates only one of first and second bank enable signals BKEN0 and BKEN1 according to a fuse that is cut corresponding to the defective unit cell.

The fuse unit 820 outputs column defect addresses YRA<3:9> in consideration of the location of the defective unit cell according to the bank active signal WLCBYF output from the bank selection unit 860. Here, the fuse unit 820 stores the location of the defective unit cell included in the two adjacent banks. Similarly to the fuse unit 220 illustrated in FIG. 2, a fuse corresponding to the column address of logic high level of the defective unit cell is cut among fuses corresponding to the cell MAT selection signal according to a row address of the defective unit cell in the fuse unit 820.

The comparison unit 840 compares the column defect addresses YRA<3:9> with the external column addresses AYT<3:9> when the defect generation signal YREN is activated. Then, the comparison unit 840 outputs redundancy enable signals SYEB_BK0 and SYEB_BK1 indicating that an address signal to be replaced is required if the column address AYT<3:9> accesses the defective unit cell. At this time, by only using the column defect address YRA<3:9> output from the fuse unit 820, it is difficult to determine which bank the defective unit cell belongs to. Therefore, according to whether the first and second bank enable signals BKEN0 and BKEN1 output from the bank selection unit 860 are activated, the comparison unit 840 determines which bank the detective unit cell belongs to.

Figure 9:
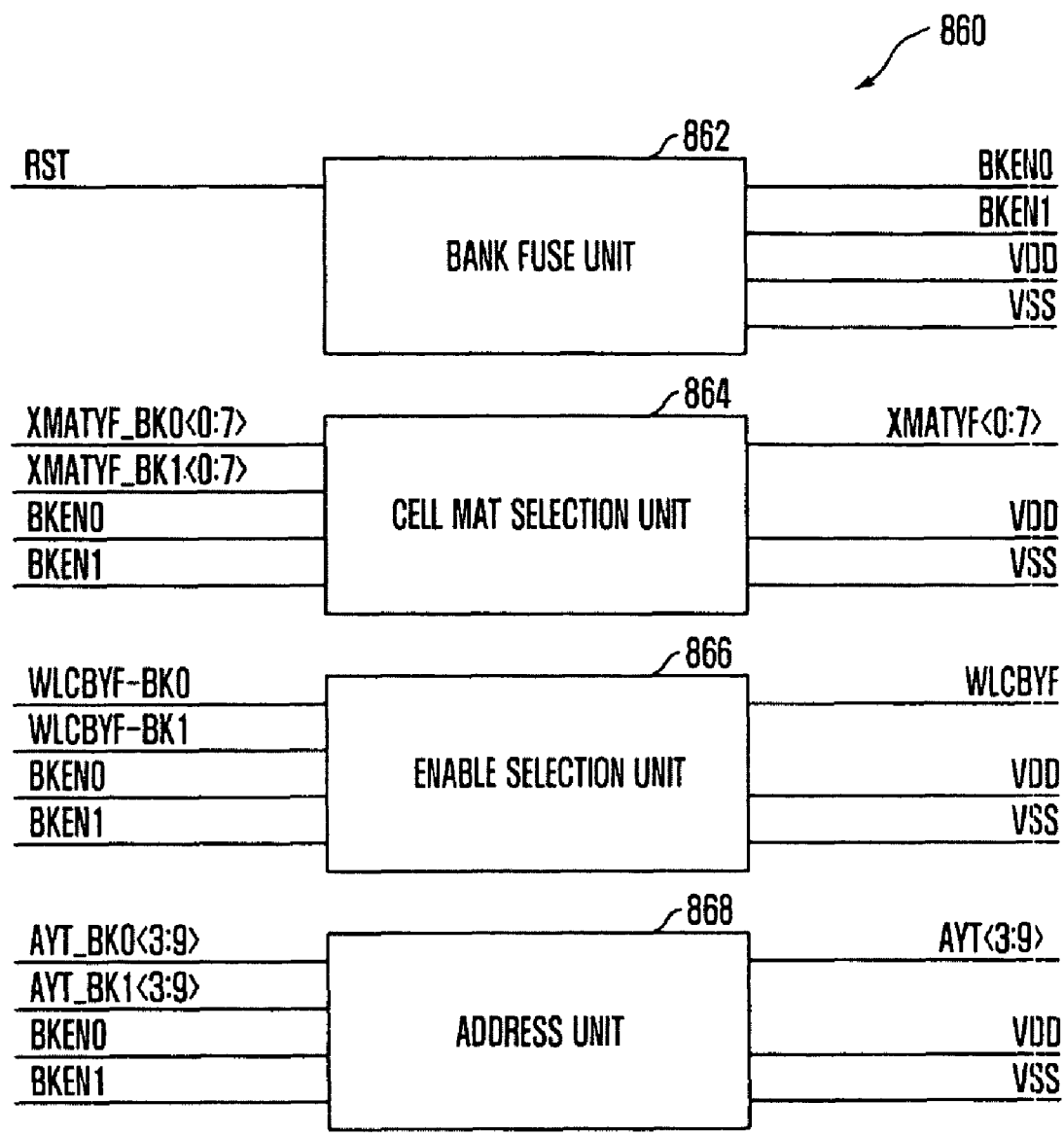
FIG. 9 is a block diagram of a bank selection unit in FIG. 8.

FIG. 9 is a block diagram of the bank selection unit 860 in FIG. 8.

Referring to FIG. 9, the bank selection unit 860 includes a bank fuse unit 862, a cell MAT selection unit 864, an enable selection unit 866, and an address selection unit 868. The bank fuse unit 862 outputs the first and second bank enable signals BKEN0 and BKEN1 so as to perform a redundancy operation on a bank having a defective unit cell by cutting a fuse corresponding to the bank. The cell MAT selection unit 864 determines whether to transfer the cell MAT selection signals XMATYF_BK0<0:7> and XMATYF_BK1<0:7> according to the first and second bank enable signals BKEN0 and BKEN1. The enable selection unit 866 determines whether to transfer the bank active signals WLCBYF_BK0 and WLCBYF_BK1 according to the first and second bank enable signals BKEN0 and BKEN1. The address selection unit 868 determines whether to transfer the column addresses AYT_BK0<3:9> and AYT_BK1<3:9> according to the first and second bank enable signals BKEN0 and BKEN1.

FIG. 10A is a circuit diagram of the bank fuse unit 862 in FIG. 9.

Referring to FIG. 10A, the bank fuse unit 862 includes a first fuse F1 that is cut when the defective unit cell exists in one of the two adjacent banks, and a second fuse F2 that is cut when the defective unit cell exists in the other one of the two adjacent banks. The bank fuse unit 862 may perform a defect repair operation according to data of the defective unit cell in the two adjacent banks corresponding to states of the first and second fuses F1 and F2 when the reset signal RST is deactivated.

Operation of the bank fuse unit 862 will be described in detail below. First, if the reset signal RST is activated to logic high level while the first and second fuses F1 and F2 are not cut, both the first and second enable signals BKEN0 and BKEN1 are activated to logic high level. However, the first and second fuses F1 and F2 corresponding to a bank having the defective unit cell are cut according to location data of the defective unit cell of one of the two adjacent banks in the fuse unit 820. Thereafter, when the reset signal RST is deactivated to logic low level, the bank enable signal BKEN0 and BKEN1 corresponding to the fuse, which has been cut, maintains its active state of logic high level but the bank enable signal BKEN0 and BKEN1 corresponding to the fuse that is not cut out is deactivated to logic low level. The first and second bank enable signals BKEN0 and BKEN1 generated according to the states of the first and second fuses F1 and F2 are input to the cell MAT selection unit 864, the enable selection unit 866, and the address selection unit 868.

Figure 10B:
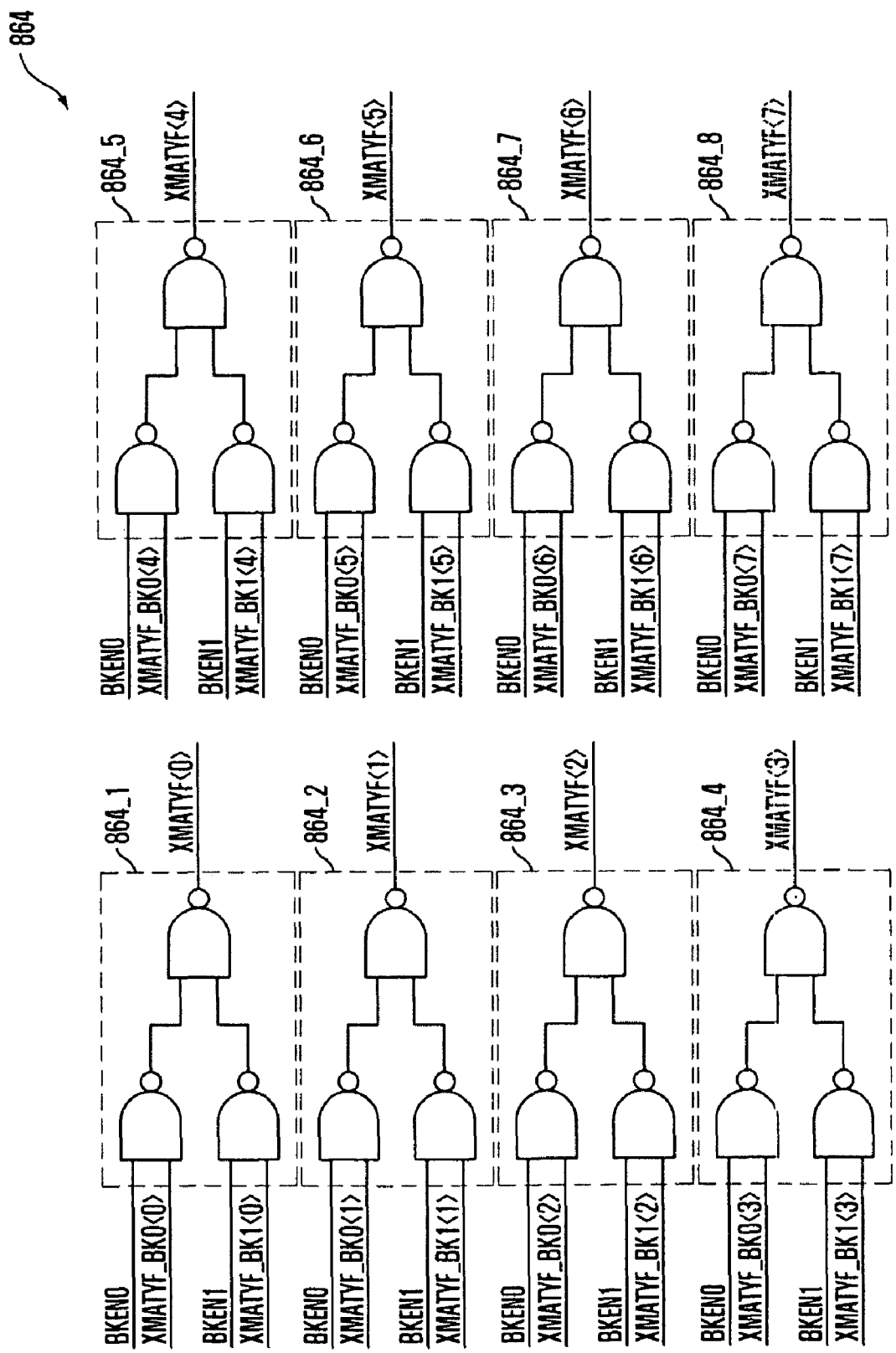
FIG. 10B is a circuit diagram of a cell MAT selection unit in FIG. 9.

FIG. 10B is a circuit diagram of the cell MAT selection unit 864 in FIG. 9.

Referring to FIG. 10B, the cell MAT selection unit 864 includes selection units 864_1 to 864_8 to perform logic operation on the cell MAT selection signals XMATYF_BK0<0:7> and XMATYF_BK1<0:7> of the two adjacent banks. Each of the selection units 864_1 to 864_8 includes a first logic gate, a second logic gate, and a third logic gate. The first logic gate receives the cell MAT selection signal XMATYF_BK0<0:7> of one of the two adjacent banks to determine whether to transfer the cell MAT selection signal XMATYF_BK0<0:7> according to the first bank enable signal BKEN0 output from the bank fuse unit 862. The second logic gate receives the cell MAT selection signal XMATYF_BK1<0:7> of the other one of the two adjacent banks to determine whether to transfer the cell MAT selection signal XMATYF_BK1<0:7> according to the second bank enable signal BKEN1 output from the bank fuse unit 862. The third logic gate transfers outputs of the first and second logic gates to the fuse unit 820.

Figure 10C:
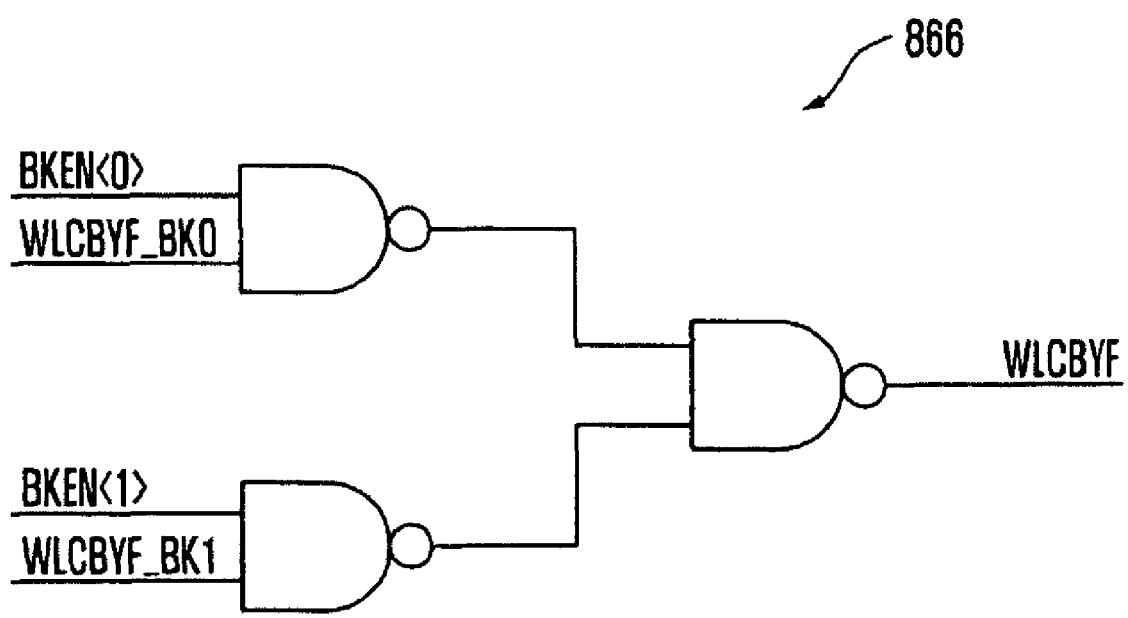
FIG. 10C is a circuit diagram of an enable selection unit in FIG. 9.

FIG. 10C is a circuit diagram of the enable selection unit 866 in FIG. 9.

Referring to FIG. 10C, the enable selection unit 866 determines whether one of the bank active signals WLCBYF_BK0 and WLCBYF_BK1 for accessing each of the two adjacent banks according to the first and second bank enable signals BKEN0 and BKEN1 output from the bank fuse unit 862.

The enable selection unit 866 includes three NAND gates, and notifies to the fuse unit 866 that the bank active signals WLCBYF_BK0 and WLCBYF_BK1 for accessing the corresponding bank according to the first and second bank enable signals BKEN0 and BKEN1.

Figure 10D:
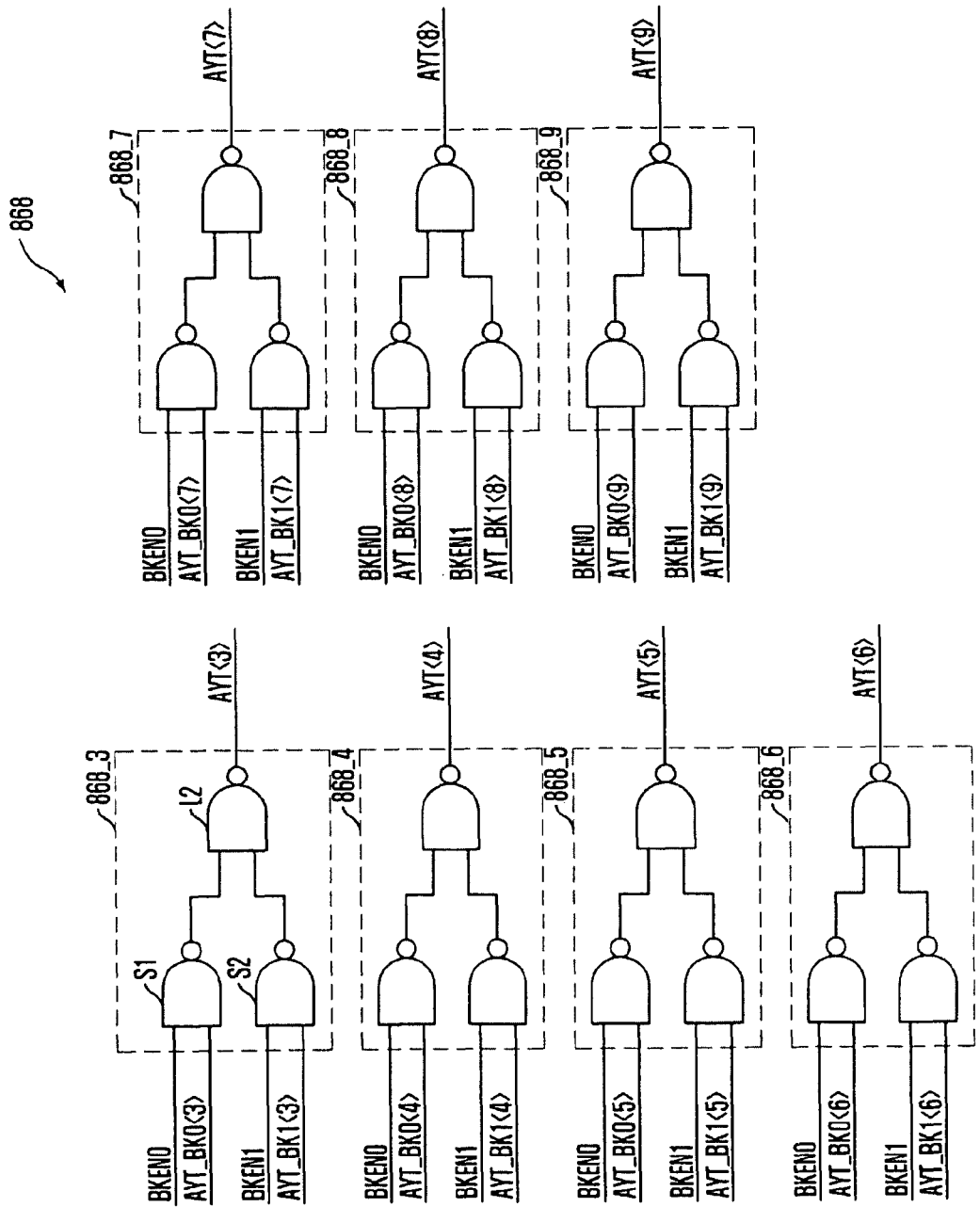
FIG. 10D is a circuit diagram of an address selection unit in FIG. 9.

FIG. 10D is a circuit diagram of the address selection unit 868 in FIG. 9.

Referring to FIG. 10D, the address selection unit 868 has a similar structure to that of the cell MAT selection unit 864. As described above, the cell MAT selection unit 864 selectively transfers the cell MAT selection signals XMATYF_BK0<0:7> and XMATYF_BK1<0:7> according to the first and second bank enable signals BKEN0 and BKEN1, whereas the address selection unit 868 selectively transfers column addresses AYT_BK0<3:9> and AYT_BK1<3:9> for accessing a unit cell in the two adjacent banks according to the first and second bank enable signals BKEN0 and BKEN1.

In detail, the address selection unit 868 includes unit selection units 868_3 to 868_9 corresponding to each bit of the column address. Each of the unit selection units includes a first selector S1, a second selector S2, and a logic gate L2. The first selector S1 receives the column address AYT_BK0<3:9> for accessing a unit cell in one of the two adjacent banks, and determines whether to transfer it according to the first bank enable signal BKEN0. The second selector S2 receives the column address AYT_BK1<3:9> for accessing a unit cell in the other one of the two adjacent banks, and determines whether to transfer it according to the second bank enable signal BKEN1. The logic gate L2 performs logic operation on outputs of the first and second selectors S1 and S2 to transfer the result to the fuse unit 820.

The aforesaid bank selection unit 860 receives a signal related to an access to an adjacent bank according to data of one of the adjacent two banks having the defective unit cell, and transfers the received signal to the fuse unit 820 and the comparison unit 840. Here, the fuse unit 820 is identical in configuration and operation to the fuse unit 220 of FIG. 2, and thus further description will be omitted herein. Configuration and operation of the comparison unit 840 will be set forth below.

Figure 11:
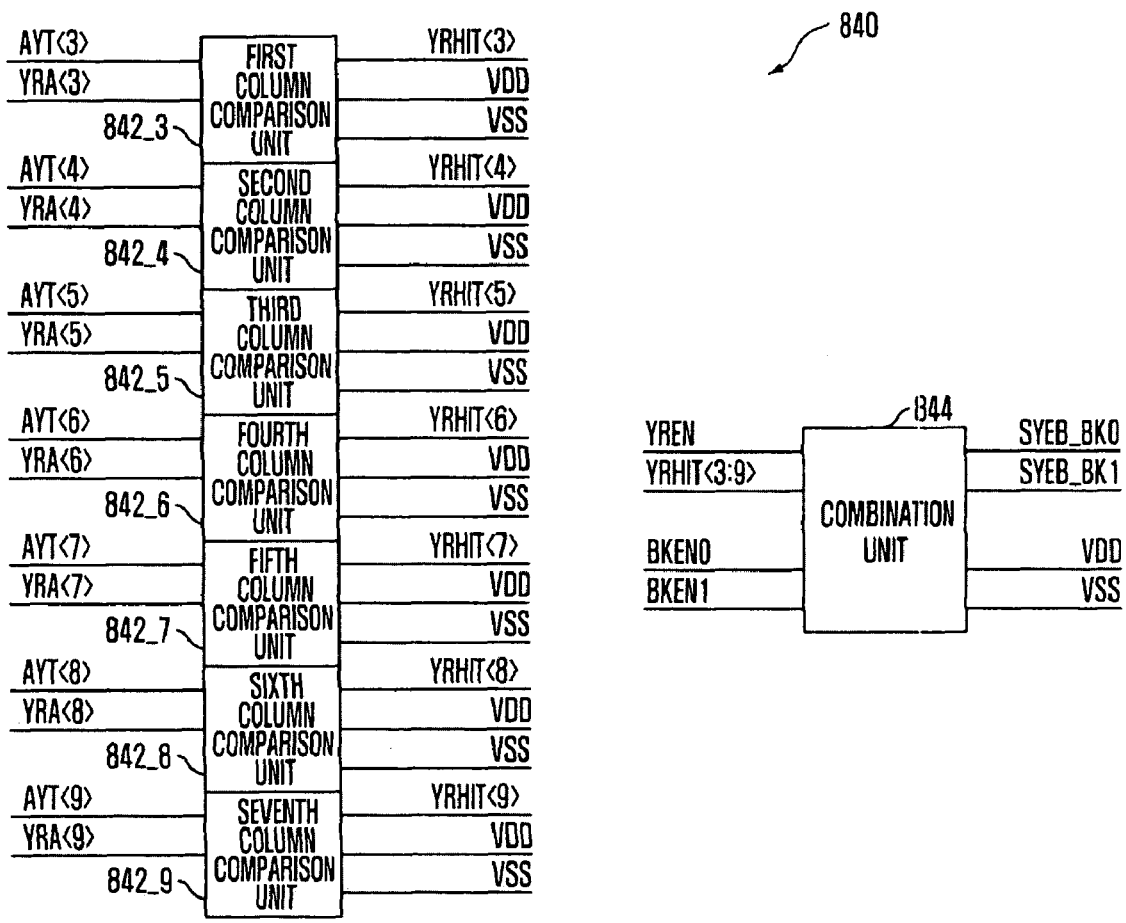
FIG. 11 is a circuit diagram of a comparison unit in FIG. 8.

FIG. 11 is a circuit diagram of the comparison unit 840 in FIG. 8.

Referring to FIG. 11, the comparison unit 840 includes column comparison units 842_3 to 842_9 and a combination unit 844. The column comparison units 842_3 to 842_9 compare the column address AYT<3:9> output from the bank selection unit 860 with the column defect address YRA<3:9> output from the fuse unit 820. The combination unit 844 combines comparison results YRHIT<3:9> of the column comparison units 842_3 to 842_9 to notify whether to perform a defect repair operation. Here, number of the column comparison units 842_3 to 842_9 corresponds to numbers of the column addresses AYT<3:9> and the column defect addresses YRA<3:9>.

The column comparison units 842_3 to 842_9 are identical in configuration and operation to the column comparison units 242_3 to 242_9 illustrated in FIG. 5. For example, when the column defect address YRA<3> output from the fuse unit 820 has logic high level, the first column comparison unit 842_3 transfers the column address AYT<3> as the comparison result YRHIT<3> without a change in logic level. When the column defect address YRA<3> has logic low level, the first column comparison unit 842_3 inverts the logic level of the column address AYT<3> to transfer the inverted column address as the comparison result YRHIT<3>. As described above, in the fuse unit 820, a fuse corresponding to the column address of logic high level of the defective unit cell is cut out among the fuses for storing the location data of the defective cell of the unit cells in the adjacent bank. Therefore, if the column address AYT<3:9> input to the column selection units 842_3 TO 842_9 is identical to the column address of the defective unit cell, all of the column comparison units 842_3 to 842_9 output the comparison result YRHIT<3:9> of logic high level.

Figure 12:
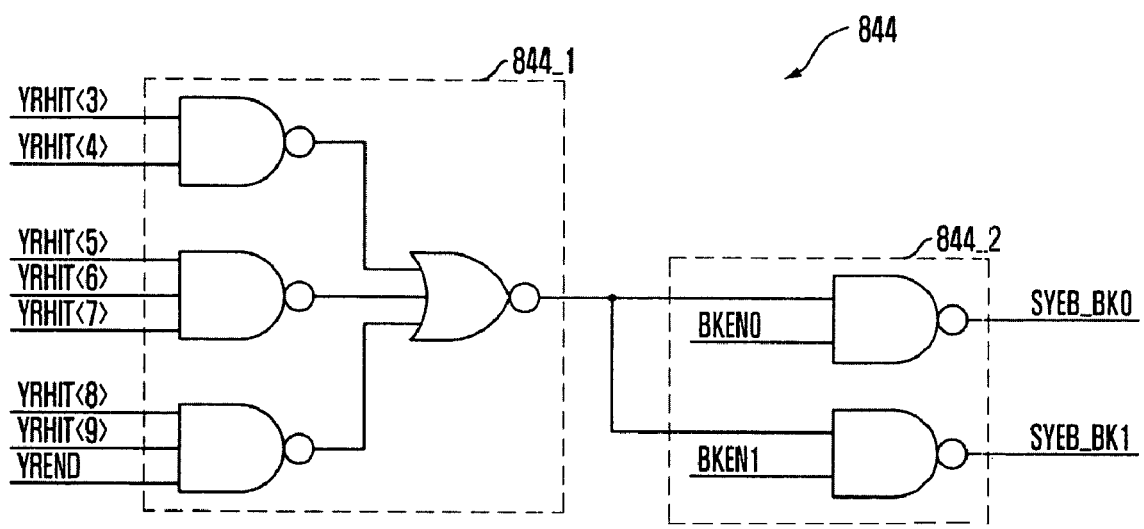
FIG. 12 is a block diagram of a combination unit in FIG. 11.

FIG. 12 is a block diagram of the combination unit 844 in FIG. 11.

As described above, the combination unit 844 includes a logical OR unit 844_1 configured to adding the comparison results YRHIT<3:9> of the column comparison units 842_3 to 842_9, and a determination unit 844_3 configured to output an output of the logical OR unit 844_1 according to the first and second bank enable signals BKEN0 and BKEN1 output from the bank selection unit 860. The combination unit 844 allows a defect repair operation to be performed on either or both of the two adjacent banks.

In practice, it is rare that the two adjacent banks are activated simultaneously because the simultaneous activation may cause an error in internal operation such as data collision to occur. Meanwhile, when unit cells corresponding to the same location data in the two adjacent banks have defects, both the first and second bank enable signals BKEN0 and BKEN1 may be activated. However, the first and second redundancy enable signals SYEB_BK0 and SYEB_BK1 output from the combination unit 844 are not activated at the same time because only one of the two adjacent banks is accessed.

As described above, a method of performing a defect repair operation on the defective unit cell using the redundancy circuit of the invention includes: storing location data of a defective unit cell in two adjacent banks; outputting column location data of the defective unit cell having the same row address in the two banks; comparing the column location data with a column address; and notifying whether to perform a defect repair operation according to which bank the defective unit cell is include between the two banks in case where the column location data is consistent with the column address. Here, the storing of the location data of the defective unit cell includes cutting a fuse corresponding to a column address of logic high level among fuses corresponding to row data such as a cell MAT selection signal. In the outputting of the column location data of the defective unit cell, only the column location data of the defective unit cell corresponding to row data is output when the row data is input.

Through the above-described process, location data of the defective unit cell can be stored in the redundancy circuit shared by two adjacent banks among unit cells in the two adjacent banks, thus making it possible to reduce the number of redundancy circuits that has been provided in every bank in a conventional semiconductor memory device. Furthermore, since the semiconductor memory device of the invention does not employ a conventional structure where each bank contacts a peripheral circuit region, but employs a stack bank structure where column control regions of adjacent banks are arranged to contact each other, number of the redundancy circuits of the two adjacent banks can be reduced by half, resulting in a decrease in a total area of the semiconductor memory device.

In particular, even though the number of the redundancy circuits is reduced, a defect repair operation, which has been provided by the conventional redundancy circuit, can be still supported. Rather, the defective unit cell does not occur so that it is possible to effectively use the redundancy circuits because it is possible to prevent fuses from being unnecessarily consumed. That is, when number of defective unit cells occurring in one bank of the two adjacent banks is greater than that occurring in the other bank, a defect repair operation is performed by connecting the redundancy circuits, of which number is greater than the number of the other bank, to the corresponding bank because the redundancy circuits are all connected to the two adjacent banks.

As describe above, in the semiconductor memory device of the invention having a stack bank structure where column control regions of two adjacent banks are arranged to contact each other, the two adjacent banks share one redundancy circuit to reduce number of total redundancy circuits, which makes it possible to reduce a total area of the semiconductor memory device.

Furthermore, even though number of redundancy circuits is reduced, the semiconductor memory device of the invention can also support a defect repair operation, which has been provided by a conventional redundancy circuit configuration. In addition, the number of fuses, which are unnecessarily consumed even when there is no defective unit cell, can be saved, so that the redundancy circuit can be efficiently used.

While the invention has been described with respect to the specific embodiments, it will be apparent to those skilled in the art that various changes and modifications may be made without departing from the spirit and scope of the invention as defined in the following claims.

What is claimed is:

1. A semiconductor memory device comprising a plurality of banks, each of which includes a plurality of unit cells, wherein two or more adjacent banks of the plurality of banks share a redundancy circuit configured to perform a defect repair operation when an address for accessing a defective unit cell is input,
    wherein the redundancy circuit includes:
        a bank selection unit configured to output data of a bank including the defective unit cell between the two adjacent banks:
        a fuse unit configured to output location data locating the defective unit cell according to a row address for accessing the two adjacent banks; and
        a comparison unit configured to determine whether to perform a defect repair operation according to an output of the bank selection unit after comparing the location data output by the fuse unit with an input column address.

2. The semiconductor memory device as recited in claim 1, wherein the bank selection unit includes:
    a bank fuse unit configured to perform a redundancy operation on a corresponding bank by cutting a fuse corresponding to the bank including the defective unit cell;
    a cell MAT selection unit configured to determine whether to transfer a cell MAT selection signal according to an output by the bank fuse unit;
    an enable selection unit configured to determine whether to transfer a bank active signal according to the output by the bank fuse unit; and
    an address selection unit configured to determine whether to transfer the column address according to the output by the bank fuse unit.

3. The semiconductor memory device as recited in claim 2, wherein the bank fuse unit includes:
    a first fuse that is cut when the defective unit cell exists in one of the two adjacent banks; and
    a second fuse that is cut when the defective unit cell exists in the other one of the two adjacent banks,
    wherein the defect repair operation is performed on the two adjacent banks depending on the location data locating the defective unit cell according to states of the first and second fuses when a reset signal is deactivated.

4. The semiconductor memory device as recited in claim 2, wherein the cell MAT selection unit includes:
    a first logic unit configured to receive the cell MAT selection signal of one of the two adjacent banks to determine whether to transfer the received cell MAT selection signal according to the location data output by the bank fuse unit; and
    a second logic unit configured to receive the cell MAT selection signal of the other one of the two adjacent banks to determine whether to transfer the received cell MAT selection signal according to the output of the bank fuse unit.

5. The semiconductor memory device as recited in claim 2, wherein the enable selection unit determines whether to transfer one of bank active signals for accessing each of the two adjacent banks according to the output of the bank fuse unit.

6. The semiconductor memory device as recited in claim 2, wherein the address selection unit includes:
    a first selection unit configured to receive the column address for accessing a unit cell of one of the two adjacent banks to determine whether to transfer the received column address according to the output of the bank fuse unit; and,
    a second selection unit configured to receive the column address for accessing a unit cell of the other one of the two adjacent banks to determine whether to transfer the received column address according to the output of the bank fuse unit.

7. The semiconductor memory device as recited in claim 1, wherein the comparison unit includes:
    a plurality of column comparison units configured to compare addresses output from the bank selection unit and the fuse unit; and
    a combination unit configured to combine comparison results of the plurality of column comparison units to notify whether to perform the defect repair operation according to the combined comparison results.

8. The semiconductor memory device as recited in claim 7, wherein the combination unit includes:
    a logical OR unit configured to add comparison results of the plurality of column comparison units; and
    a determination unit configured to perform the defect repair operation on either or both of the two adjacent banks by outputting an output of the logical OR unit according to an output of the bank selection unit.

9. The semiconductor memory device as recited in claim 7, wherein the fuse unit includes a plurality of fuses configured to store location data of the defective unit cell of the plurality of unit cells of the adjacent banks, wherein a fuse among the plurality of fuses corresponding to the column address of logic high level of the defective unit cell is cut.

10. A semiconductor memory device comprising a redundancy circuit configured to perform a defect repair operation through stored data of a defective unit cell in two adjacent banks when an input address for accessing data corresponds to the defective unit cell,
    wherein the semiconductor memory device has a stack bank structure where column control regions of the two banks are in contact with each other, wherein the redundancy circuit is disposed between the two adjacent banks and includes:
- a bank selection unit configured to output data of one of the two adjacent banks including the defective unit cell;
- a fuse unit configured to output location data locating the defective unit cell according to a row address for accessing the two adjacent banks; and
- a comparison unit configured to determine whether to perform the defect repair operation according to an output of the bank selection unit after comparing the location data output by the fuse unit with an input column address.

11. The semiconductor memory device as recited in claim 10, wherein the bank selection unit includes:
- a bank fuse unit configured to perform a redundancy operation on a bank including the defective unit cell by cutting a fuse corresponding to the bank;
- a cell MAT selection unit configured to determine whether to transfer the cell MAT selection signal according to an output by the bank fuse unit,
- an enable selection unit configured to determine whether to transfer a bank active signal according to the output by the bank fuse unit; and
- an address selection unit configured to determine whether to transfer the column address according to an output by the bank fuse unit.

12. The semiconductor memory device as recited in claim 11, wherein the comparison unit includes:
- a plurality of column comparison units configured to compare addresses output by the bank selection unit and the fuse unit; and
- a combination unit configured to combine comparison results of the plurality of column comparison units to perform a defect repair operation according to the combined comparison results.

13. A method of repairing a defective unit cell in a semiconductor memory device, the method comprising:
- storing location data locating a unit cell of two adjacent banks;
- outputting column location data locating the defective unit cell, the defective unit cell having a row address in the two banks;
- comparing the column location data with a column address; and
- notifying whether to perform a defect repair operation according to which bank the defective unit cell belongs to between the two banks, when the column location data is consistent with the column address.

14. The method as recited in claim 13, wherein the storing of the location data of the defective unit cell comprises cutting a fuse corresponding to the column address of logic high level among fuses corresponding to a row address.

15. The method as recited in claim 14, wherein the outputting of the column location data of the defective unit cell comprises outputting only column location data of the defective unit cell corresponding to the row data when the row data is input.

16. A semiconductor memory device, comprising:
- a fuse unit configured to store row and column address data of a defective unit cell of two adjacent banks, and to output the column address data of the defective unit cell according to row access data;
- a bank selection unit configured to transfer the row access data and column access data of the two banks, and to output location data locating one of the two banks including the defective unit cell; and
- a comparison unit configured to compare the column access data output from the bank selection unit with the column address data output from the fuse unit, and to determine whether to perform a defect repair operation according to the location data of a bank including the defective unit cell, which is output from the bank selection unit, when the column access data from the bank selection unit is consistent with the column address data from the fuse unit.

17. The semiconductor memory device as recited in claim 16, wherein:
- the row access data includes a bank active signal for activating a cell MAT selection signal that selects a cell matrix in each bank, and for enabling a word line in each bank; and
- the column access data includes a column address of each unit cell to be accessed.

18. The semiconductor memory device as recited in claim 17, wherein the bank selection unit includes:
- a bank fuse unit configured to perform a redundancy operation on a bank including the defective unit cell by cutting a fuse corresponding to the bank;
- a cell MAT selection unit configured to determine whether to transfer a cell MAT selection signal according to an output by the bank fuse unit;
- an enable selection unit configured to determine whether to transfer a bank active signal according to the output by the bank fuse unit; and
- an address selection unit configured to determine whether to transfer the column address according to the output by the bank fuse unit.

19. The semiconductor memory device as recited in claim 17, wherein the comparison unit includes:
a plurality of column comparison units configured to compare addresses output from the bank selection unit and the fuse unit; and a combination unit configured to combine comparison results of the plurality of column comparison units to notify whether to perform the defect repair operation according to the combined comparison results.

* * * * *